(12) United States Patent
Fu et al.

(10) Patent No.: US 8,496,497 B2
(45) Date of Patent: Jul. 30, 2013

(54) MOUNTING APPARATUS FOR FLASH DRIVE

(75) Inventors: Li-Ren Fu, Shenzhen (CN);
Zheng-Heng Sun, New Taipei (TW)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 67 days.

(21) Appl. No.: 13/337,316

(22) Filed: Dec. 27, 2011

(65) Prior Publication Data
US 2013/0164972 A1 Jun. 27, 2013

(30) Foreign Application Priority Data
Dec. 21, 2011 (CN) .......................... 2011 1 0432378

(51) Int. Cl.
*H01R 13/62* (2006.01)
(52) U.S. Cl.
USPC ......................................... 439/372; 439/374

(58) Field of Classification Search
USPC ................................ 439/372–374; 361/679.4
See application file for complete search history.

(56) References Cited

U.S. PATENT DOCUMENTS

| | | | | |
|---|---|---|---|---|
| 5,464,351 | A * | 11/1995 | Oka .............................. | 439/372 |
| 6,508,660 | B2 * | 1/2003 | Self .............................. | 439/374 |
| 6,822,466 | B1 * | 11/2004 | Holcombe et al. ....... | 324/750.25 |
| 2012/0147540 | A1 * | 6/2012 | Peng et al. ................. | 361/679.4 |

* cited by examiner

*Primary Examiner* — Hien Vu
(74) *Attorney, Agent, or Firm* — Altis Law Group, Inc.

(57) ABSTRACT

A mounting apparatus is used to fix a flash drive mounted on a circuit board with a connector. The mounting apparatus is mounted on the circuit board and receives the flash drive and connector. The mounting apparatus includes a base board, and a first sidewall and a second sidewall opposite to each other. The second sidewall defines a receiving space. The first sidewall is pivotably connected to the first sidewall, and includes a deformable engaging portion, away from the first sidewall, to be engaged in the receiving space.

7 Claims, 4 Drawing Sheets

MOUNTING APPARATUS FOR FLASH DRIVE

BACKGROUND

1. Technical Field

The present disclosure relates to an apparatus for mounting a flash drive.

2. Description of Related Art

In some computers, programs for driving some elements mounted on circuit boards of the computers are stored in flash drives, such as universal serial bus (USB) flash drives, which are detachable from the computers. However, these USB flash drives are generally engaged with connectors of the computers directly. As a result, the USB flash drives may easily disengage from the corresponding connectors after impact and vibration of the computers or the USB flash drives.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
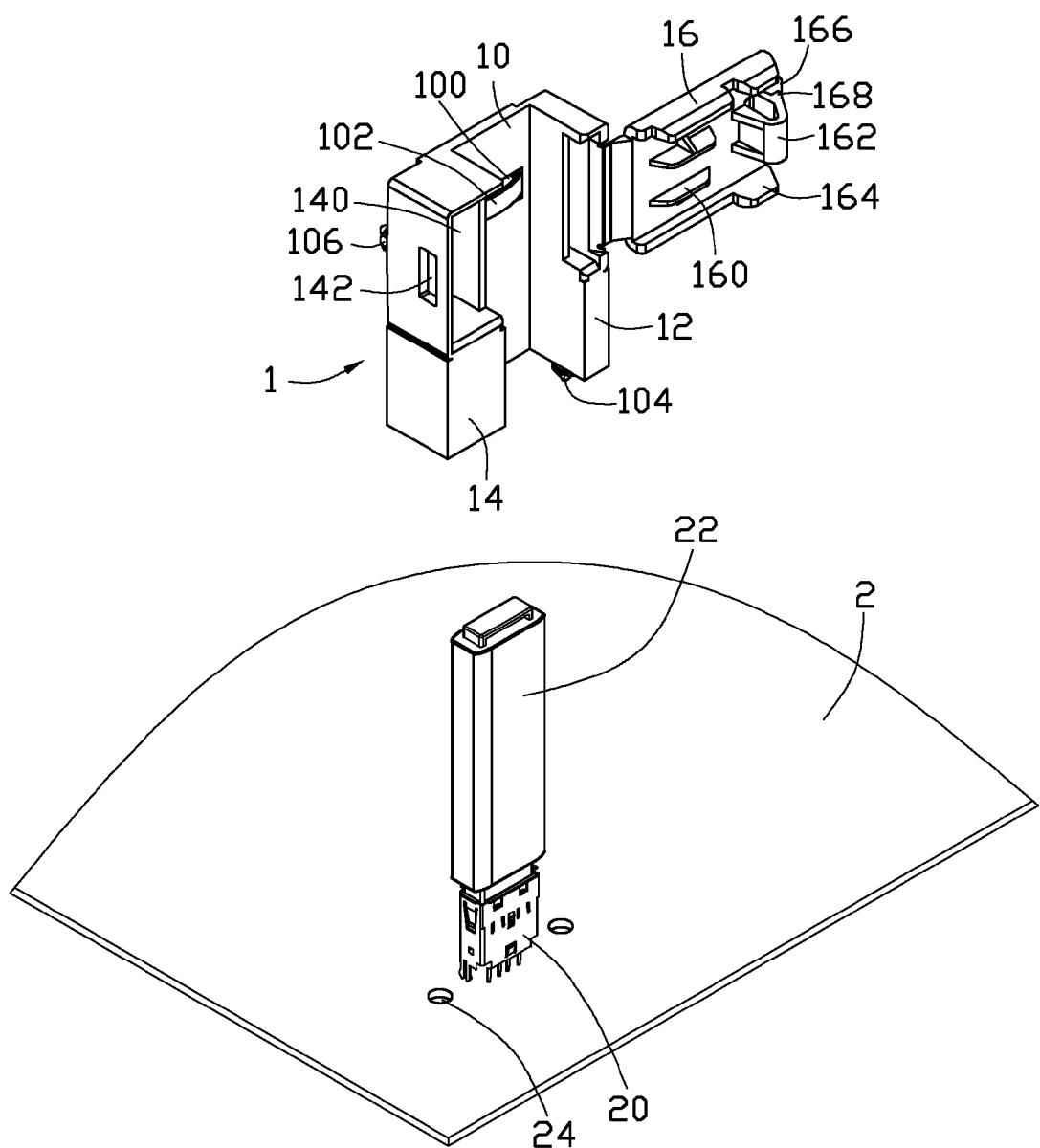
FIG. 1 is an exploded, isometric view of an exemplary embodiment of a mounting apparatus, together with a universal serial bus (USB) flash drive.
Figure 2:
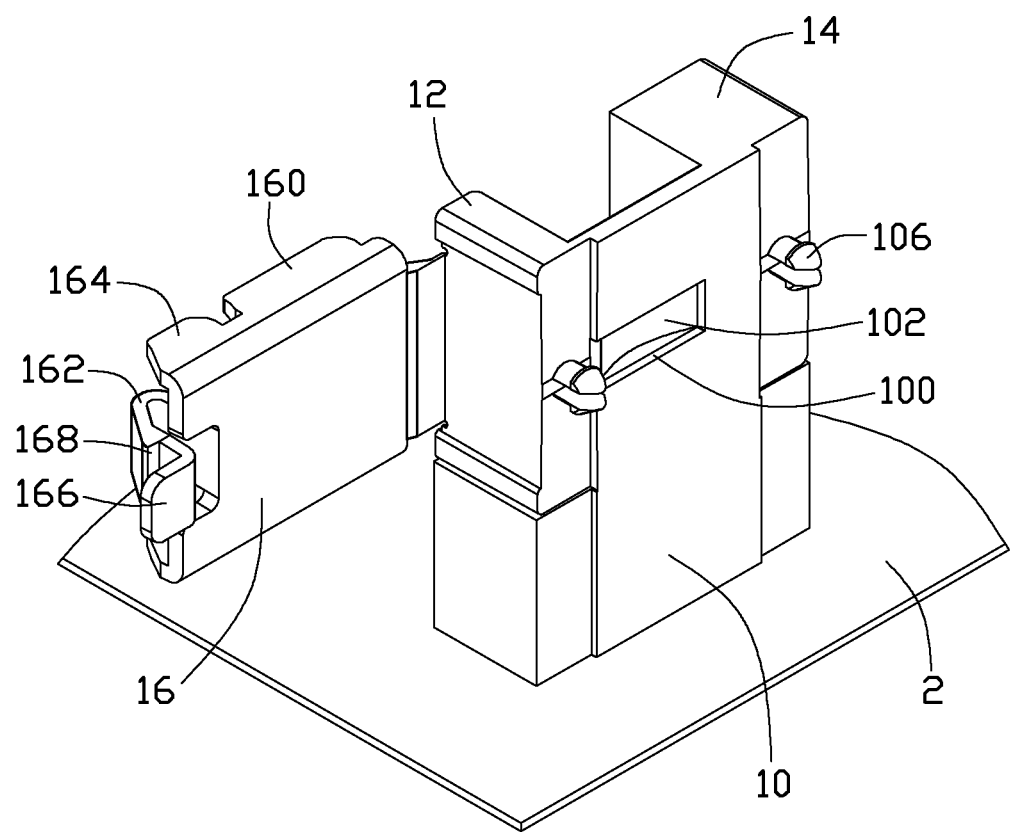
FIG. 2 is a partially assembled view of FIG. 1, but viewed from another perspective.
Figure 3:
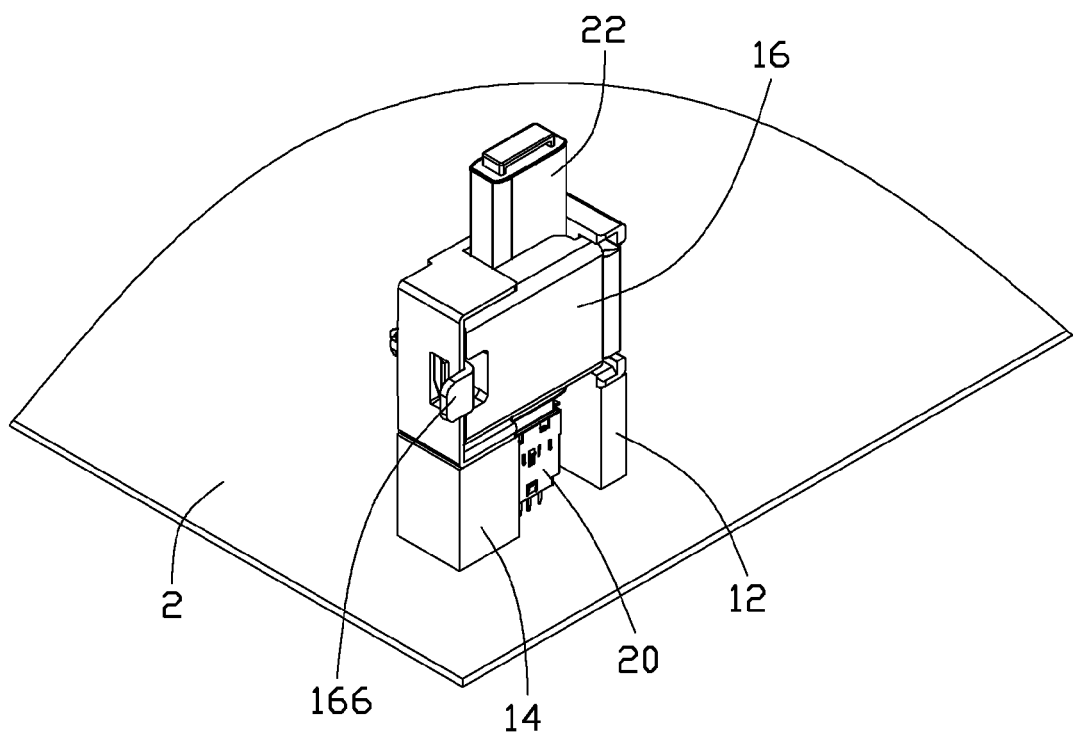
FIG. 3 is an assembled, isometric view of the mounting apparatus and the USB flash drive of FIG. 1.

FIGS. 1 and 2, show an exemplary embodiment of a mounting apparatus 1 is used to fix a flash drive, such as a universal serial bus (USB) flash drive 22, which is engaged with a connector 20 mounted on a circuit board 2.

The mounting apparatus 1 includes a rectangular base board 10, and a first sidewall 12 and a second sidewall 14 extending forward from opposite sides of the base board 10.

A cover 16 is integrally formed on an upper portion of a side of the first sidewall 12 opposite to the base board 10, capable of pivoting about a junction between the first sidewall 12 and the cover 16. A plurality of bars 160 protrudes from an inner surface of the cover 16 facing the base board 10. A V-shaped engaging portion 162 and two protrusions 164 positioned at opposite sides of the engaging portions 162 are formed on the inner surface of a distal end of the cover 16 opposite to the junction. The engaging portion 162 has a first end fixed to the cover 16, a cantilevered second end opposite to the first end and away from the first sidewall 12, and an operation portion 166 extending from the second end. A locking portion 168 extends out from an outer surface of the engaging portion 162 adjacent to the operation portion 166.

The second sidewall 14 defines a receiving space 140 corresponding to the cover 16. An engaging slot 142 is defined in a side surface of the second sidewall 14 away from the first sidewall 12 and communicates with the receiving space 140.

The base board 10 defines a slot 100 in an upper portion. The slot 100 extends through a front side surface and a rear side surface of the base board 10 and perpendicular to the first and second sidewalls 12 and 14. An arc-shaped deformable resilient piece 102 is formed on the front side surface of the base board 10, with opposite ends of the resilient piece 102 connected to the front side surface of the base board 10 at opposite ends of the slot 100.

The first and second sidewalls 12 and 14 each form a deformable leg 104 at an end surface away from the slot 100. Two legs 106 extend out from the rear side surface of the base board 10. Each of the legs 104 and 106 has a tapered distal end.

The circuit board 2 defines two fixing holes 24 at opposite sides of the connector 20.

In assembling of the mounting apparatus 1 to the circuit board 2, the legs 104 of the first and second sidewalls 12 and 14 are deformed to extend through the corresponding fixing holes 24, and then are blocked by a bottom surface of the circuit board 2, to perpendicularly mount the mounting apparatus 1 to the circuit board 2. The connector 20 is received in the mounting apparatus 1.

In use, the USB flash drive 22 is inserted into the connector 20 and sandwiched between the first and second sidewalls 12 and 14. The cover 16 is pivoted toward the second sidewall 14 to insert the engaging portion 162 into the receiving space 140, until the locking portion 168 is engaged in the engaging slot 142. The resilient piece 102 and the bars 160 sandwich opposite sides of the USB flash drive 22.

In disassembling the USB flash drive 22, the operation portion 166 is moved toward the first sidewall 12 to disengage the locking portion 168 from the engaging slot 142. After the cover 16 is opened, the USB flash drive 42 can be readily removed from the connector 40.

Figure 4:
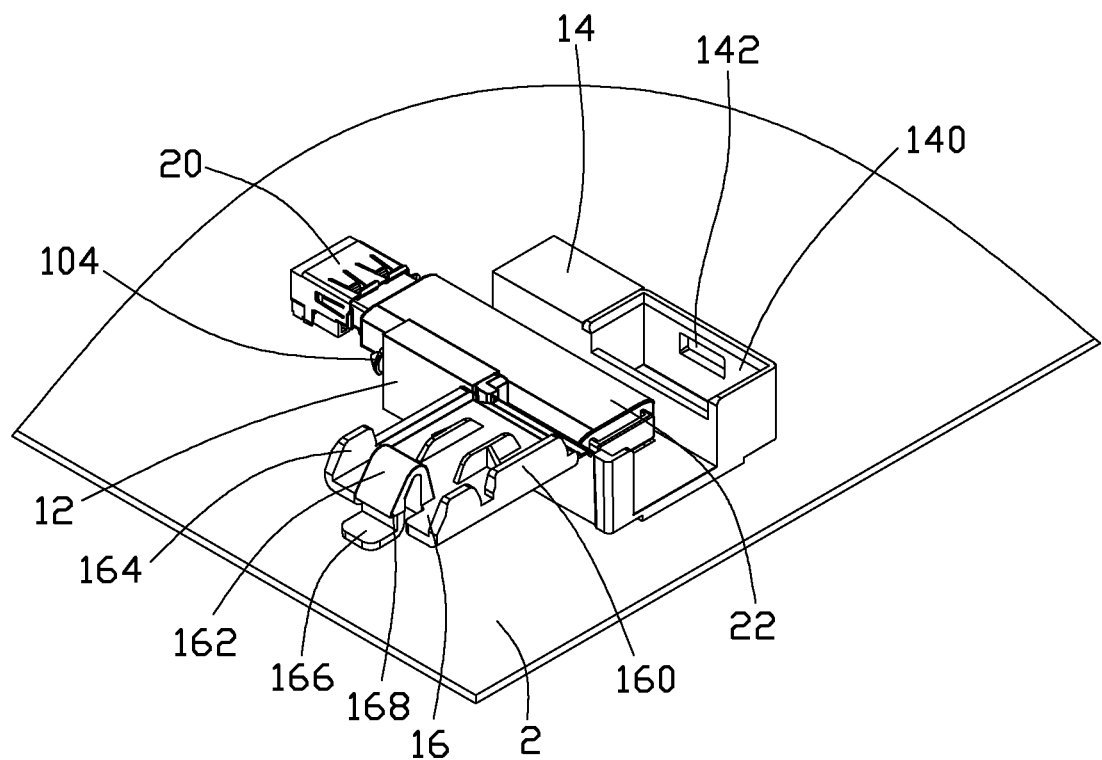
FIG. 4 is a partially assembled view of the mounting apparatus of FIG. 1 horizontally mounted on a circuit board to hold a flash drive on the circuit board.

Referring to FIG. 4, in another embodiment, when the connector 20 is horizontally installed on the circuit board 2, the circuit board 2 can define two fixing holes (not shown) in alignment with the connector 20. The legs 106 can be extended through the corresponding fixing holes, and blocked by the bottom surface of the circuit board 2, to horizontally mount the mounting apparatus 1 to the circuit board 2. The connector 20 is located outside and at an end of the mounting apparatus 1.

It is believed that the present embodiments and their advantages will be understood from the foregoing description, and they will be apparent that various changes may be made thereto without departing from the spirit and scope of the description or sacrificing all of their material advantages, the examples hereinbefore described merely being exemplary embodiment.

What is claimed is:

1. A mounting apparatus used to fix a flash drive to a connector of a circuit board, the mounting apparatus comprising:

a base board;

a first sidewall extending out from one of opposite sides of the base board; a second sidewall extending out from the other one of the opposite sides of the base board to sandwiched opposite sides of the flash drive together with the first sidewall, the second sidewall defining a receiving space;

a cover pivotably connected to the first sidewall, the cover comprising a deformable engaging portion, away from the first side wall, to detachably engage in the receiving space; and wherein two first legs configured for perpendicularly mounting the mounting apparatus to the circuit board, and two second legs configured for horizontally mounting the mounting apparatus to the circuit board.

2. The mounting apparatus of claim 1, wherein each of the first and second legs has a deformable tapered distal end to be extended through the circuit board and blocked by a bottom surface of the circuit board.

3. The mounting apparatus of claim 1, wherein the base board forms an arc-shaped resilient piece on an inner surface, a plurality of bars extends from an inner surface of the cover facing the base board to sandwich another two opposite sides of the flash drive together with the resilient piece.

4. The mounting apparatus of claim 3, wherein two first legs respectively extend from end surfaces of the first and second sidewalls, away from the resilient piece.

5. The mounting apparatus of claim 4, wherein two second legs extend from a rear side surface of the base board opposite to the resilient piece.

6. The mounting apparatus of claim 1, wherein the engaging portion is substantially V-shaped, and has a first end fixed to the cover, a cantilevered second end away from the first sidewall, and an operation portion extending out from the second end of the engaging portion.

7. The mounting apparatus of claim 6, wherein an engaging slot is defined in a side surface of the second sidewall away from the first sidewall and communicating with the receiving space, a locking portion extends out from an outer side surface of the engaging portion adjacent to the operation portion to be engaged in the engaging slot.

* * * * *